(12) United States Patent
Brandenburg et al.

(10) Patent No.: US 6,378,538 B1
(45) Date of Patent: Apr. 30, 2002

(54) DURABLE, MULTI-PIECE ROTOR FOR SPRAY ACID TOOLS

(75) Inventors: Clayton Daniel Brandenburg, Cedar Park; Mark Allen Campbell, Bastrop, both of TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/478,928

(22) Filed: Jan. 6, 2000

Related U.S. Application Data

(60) Provisional application No. 60/170,300, filed on Dec. 13, 1999.

(51) Int. Cl.[7] ................................................. B08B 3/02
(52) U.S. Cl. ........................ 134/201; 118/500; 134/902; 211/41.18
(58) Field of Search ................................. 134/902, 153, 134/157, 201; 118/500; 211/41.18

(56) References Cited

U.S. PATENT DOCUMENTS

| | | | | |
|---|---|---|---|---|
| 5,054,418 A | * | 10/1991 | Thompson et al. | 118/500 |
| 5,221,360 A | * | 6/1993 | Thompson et al. | 134/902 X |
| 5,482,559 A | * | 1/1996 | Imai et al. | 118/500 X |
| 6,056,123 A | * | 5/2000 | Niemirowski et al. | 211/41.18 X |
| 6,062,239 A | * | 5/2000 | Bexten | 134/157 X |
| 6,062,240 A | * | 5/2000 | Sada et al. | 134/153 X |
| 6,062,853 A | * | 5/2000 | Shimazu et al. | 211/41.18 X |
| 6,168,660 B1 | * | 1/2001 | Hayes et al. | 134/902 X |

* cited by examiner

*Primary Examiner*—Philip R. Coe
(74) *Attorney, Agent, or Firm*—Williams, Morgan & Amerson, P.C.

(57) ABSTRACT

The invention, in a first aspect is a multi-piece rotor for use in a chemical spray cleaner. The rotor comprises a top plate, a bottom plate, a plurality of struts, and a pair of retainer bars. The top plate defining an aperture keyed to a wafer cassette. The bottom plate includes an interior surface on which the wafer cassette may bottom and an exterior surface defining an aperture for receiving a rotating shaft. The struts separate the top and bottom plates, each strut fastened at a top end thereof to the top plate and at a bottom end to the bottom plate. The retaining bars fasten to adjacent ones of the struts on the radially proximal surface thereof. In a second aspect, the invention is a rotor constructed from polyphenelyne sulfide for use in a chemical spray cleaner.

16 Claims, 5 Drawing Sheets

DURABLE, MULTI-PIECE ROTOR FOR SPRAY ACID TOOLS

This application claims, under 35 U.S.C. §119(e), the earlier effective filing date of Dec. 13, 1999, from the co-pending Provisional Application Ser. No. 60/170,300, entitled "Durable, Multi-Piece Rotor For Spray Acid Tool."

BACKGROUND OF THE INVENTION

1. Field of the Invention

This invention pertains to spray-acid cleaning during semiconductor fabrication and, more particularly, a durable, multi-piece rotor for spray acid tools.

2. Description of the Related Art

Semiconductor devices, or microchips, are manufactured from wafers of a substrate material. Layers of materials are added, removed, and/or treated during fabrication to create the integrated, electrical circuits that make up the device. The fabrication essentially comprises four basic operations. The four operations are:

- layering, or adding thin layers of various materials to a wafer from which a semiconductor is produced;
- patterning, or removing selected portions of added layers;
- doping, or placing specific amounts of dopants in the wafer surface through openings in the added layers; and
- heat treatment, or heating and cooling the materials to produce desired effects in the processed wafer.

Although there are only four basic operations, they can be combined in hundreds of different ways, depending upon the particular fabrication process. See, e.g., Peter Van Zant, *Microchip Fabrication A Practical Guide to Semiconductor Processing* (3d Ed. 1997 McGraw-Hill Companies, Inc.) (ISBN 0-07-067250-4).

Wafers under fabrication frequently require a Chemical Mechanical Polishing ("CMP") process to reduce topographical variance and achieve a planarity sufficient to meet the challenging lithography requirements of microprocessor manufacturing. CMP, by microelectronic fabrication standards, is an inherently dirty process. This production step lowers wafers, device side down, onto a rotating table saturated with slurry. Water and slurry between the pad on the table and the wafer surface provide the chemical catalyst in CMP. Downward pressure applied to the back of the wafer and the aggregate suspended in the slurry solution between the wafer and the rotating table provide the mechanical catalyst in CMP.

Successfully removing slurry residuals following CMP processing aids in the successful manufacturing of operational integrated circuits. This post-polish, wafer surface conditioning consists of a chemical clean and/or a mechanical clean to reduce contamination to at least a minimally acceptable level, a direct correlation to a good die yield. Chemical cleans may employ either immersive or spray techniques. In an immersion chemical clean, the wafers are lowered into a pool of acid that cleans the slurry residuals from the wafers. In a spray chemical clean, an acid is sprayed across the wafers to clean the slurry residuals. Both of these types of cleaning operations are well known in the art. For instance, a wide variety of chemical spray cleaners are available from:

Semitool, Inc.
655 West Reserve Drive
Kalispell, Mont. 59901
Tel: (406) 752-2107
Fax: (406) 752-5522
Website: www.semitool.com Exemplary chemical spray cleaners available from Semitool, Inc. include those sold under the names Magnums® and Spray Acid Tool.

More particularly, in spray cleaning, a cassette (or "boat") holds the wafers and is securely placed on a rotor housed in a roughly circular chamber. Once the door to the chamber is closed, the rotor is spun at rates as high as 1,000 rpm. The spinning wafers are rinsed with a hot de-ionized ("DI") water and dried with a high purity nitrogen ($N_2$). A heated acid is then sprayed across the wafers as the rotor spins. The particular acid used depends on the chemical composition of the slurry. Depending on the particular process, additional rinsing/cleaning operations may be performed on the wafers as they are spun in the cassette on the rotor. Finally, the wafers are again rinsed with DI, the rotor is stopped, and the wafers are removed from the chamber.

Conventional rotor design for chemical spray designs suffers from several problems. One of these problems is structural and another is operational. More particularly, one problem arises from the materials from which the rotors are constructed and the radial clearance between the rotor and the spray nozzles. A second problem arises from the need for routine maintenance and upkeep.

First, the rotors are typically machined from a solid block of poly-tetra-fluoroethelene ("PTFE") such as is sold under the mark Teflon.® At the same time, a minimal radial clearance between the wafers and the spray nozzles is also desirable to obtain a more uniform spray pattern for fluids across the wafers. However, PTFE is not very dimensionally or thermally stable. During the cleaning operation, the temperatures involved frequently result in an inadequate radial clearance between the rotor and the spray nozzles, causing the rotor to scrape the nozzles. Even a single scrape can cause the rotor to slough PTFE particles that can contaminate the wafers, necessitating additional clean-up or even that the wafers be discarded. The scraping also aggravates variations in rotor rotation caused by load imbalances and other factors, which causes still additional scraping. Ultimately, the rotor self-destructs from the scraping and rotational variations, and this occurs more quickly as the rotor speeds increase.

Several approaches may be employed to resolve this problem. The rinse nozzles can be exchanged for shorter versions to increase the radial clearance between the rotor and the nozzles. Unfortunately, this increases the radial distance between the wafers and the nozzles and lessens the uniformity in the spray pattern on the wafers. The PTFE from which the rotor is machined can be cured prior to final machining to impart greater rigidity and more resistance to thermal expansion. However, this approach drives up the costs of the rotors. Additional steps may be taken to improve the balance of the rotors, but these steps increase the likelihood of additional problems and drives up the cost of the machine. Thus, while these approaches can reduce rotor scraping and consequent PTFE particle contamination, they adversely impact the cost and performance of the operation in other ways.

Second, the single-piece body for the rotors inhibits cleaning and repair. Because the rotors are typically constructed from a single block of PTFE, they cannot be repaired or cleaned simply by replacing clogged, scraped, or worn portions thereof They must instead be completely replaced. Even standard PTFE rotors used in conventional operations can cost several thousand dollars to replace. If cured to help preserve radial clearance as discussed above, these costs can go even higher. Attempts to construct rotors from multiple pieces resulted in rotors that lost their structural integrity and came apart at the high rotor spin speeds used in conventional chemical spray cleaning operations. Some of these multi-piece rotors were constructed from steel, but design constraints imposed by the size of the chamber resulted in a rotor that still could not remain operational.

The present invention is directed to resolving one or all of the problems mentioned above.

SUMMARY OF THE INVENTION

The invention, in a first aspect is a multi-piece rotor for use in a chemical spray cleaner. The rotor comprises a top plate, a bottom plate, a plurality of struts, and a pair of retainer bars. The top plate defining an aperture keyed to a wafer cassette. The bottom plate includes an interior surface on which the wafer cassette may bottom and an exterior surface defining an aperture for receiving a rotating shaft. The struts separate the top and bottom plates, each strut fastened at a top end thereof to the top plate and at a bottom end to the bottom plate. The retaining bars fasten to adjacent ones of the struts on the radially proximal surface thereof. In a second aspect, the invention is a rotor constructed from polyphenelyne sulfide for use in a chemical spray cleaner.

BRIEF DESCRIPTION OF THE DRAWINGS

The invention may be understood by reference to the following description taken in conjunction with the accompanying drawings, in which like reference numerals identify like elements, and in which.

Figure 1:
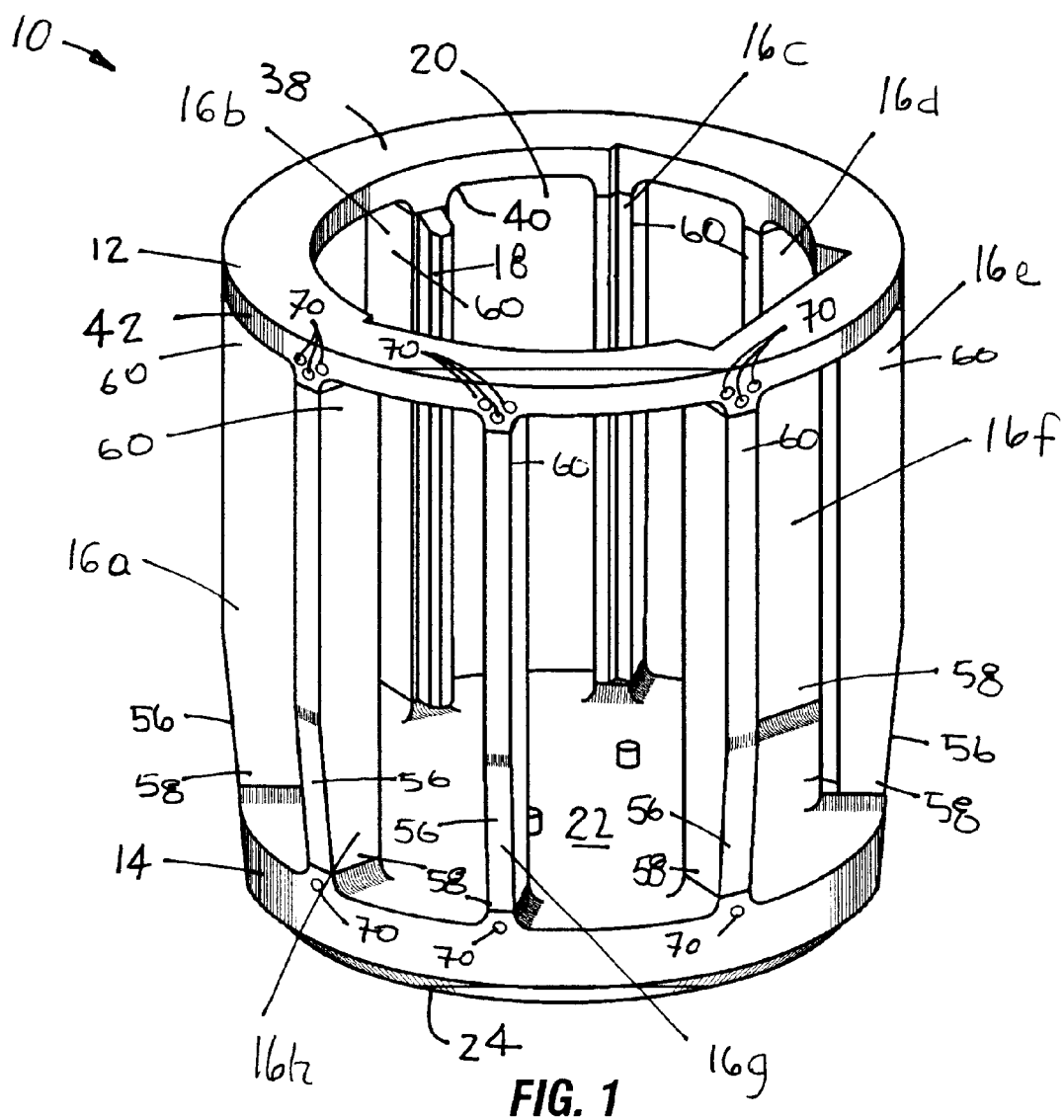
FIG. 1 is an assembled, isometric view of one embodiment of a durable, multi-piece rotor.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Figure 2:
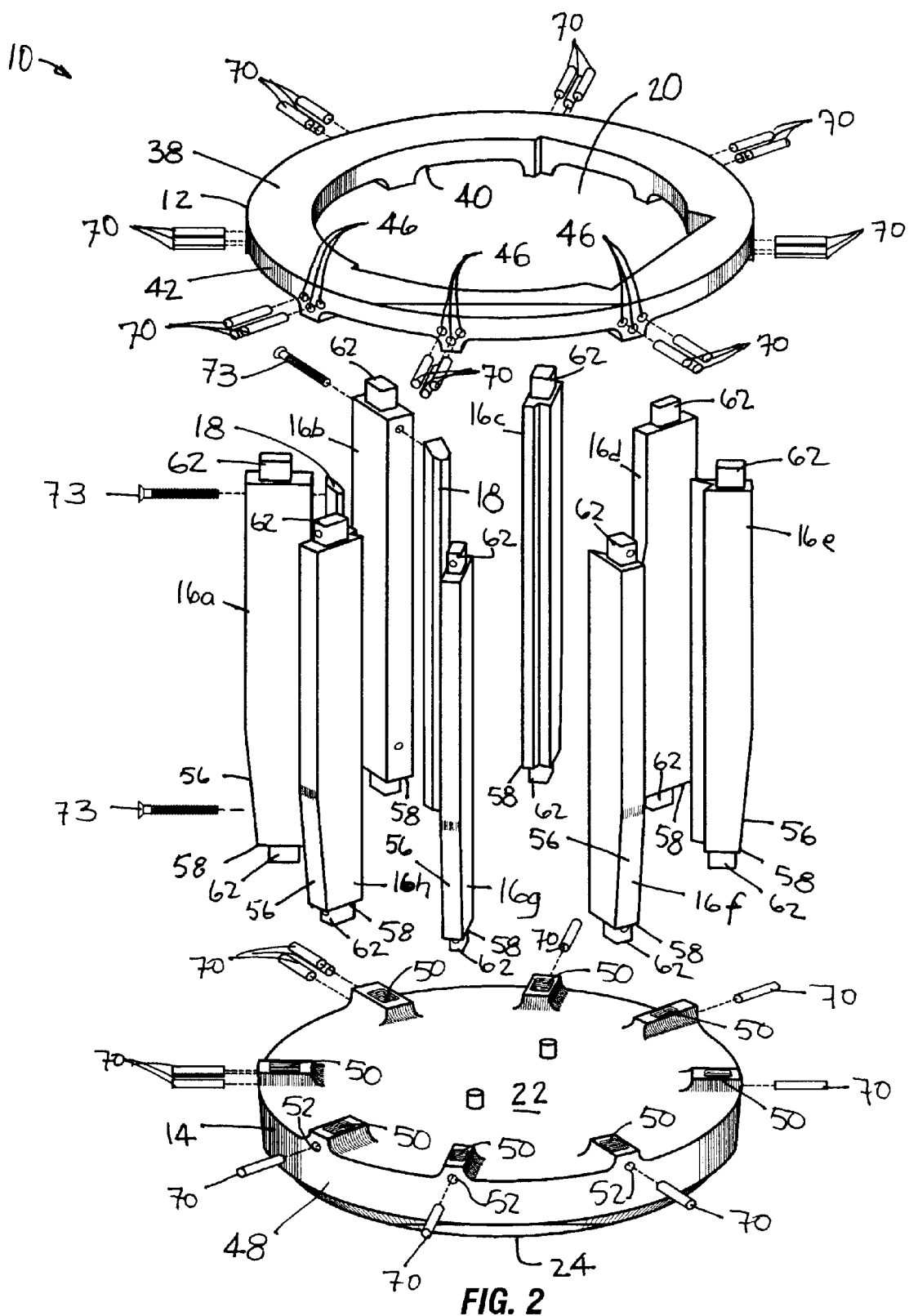
FIG. 2 is an exploded isometric view of the rotor of FIG. 1.

FIGS. 1–2 illustrate in isometric assembled and exploded views, respectively, a durable multi-piece rotor 10. The rotor 10 generally comprises a top plate 12, a bottom plate 14, a plurality of struts 16a–h, and a pair of retaining bars 18. The top plate 12 defines an aperture 20 keyed to accommodate a standard wafer cassette. The bottom plate 14 includes an interior surface 22 on which the wafer cassette may bottom and an exterior surface 24 defining an aperture 26 for receiving a rotating shaft 30 (shown in FIG. 5). The struts 16a–h separate the top and bottoms plates 12, 14. Each strut 16a–h is fastened at a top end 32a–h, respectively, thereof to the top plate 12 and at a bottom end 34a–h, respectively, to the bottom plate 14. The retaining bars 18 are fastened to adjacent ones 16a–b of the struts 16a–h on the radially proximal surface 36 thereof, shown best in FIG. 6.

Returning to FIGS. 1–2, the top plate 12 more particularly includes an exterior surface 38, an interior surface 40, and a circumferential surface 42. The top plate 12 is, in this embodiment, circularly-shaped, although the invention is not so limited. Other shapes, such as elliptical or square, might be used in alternative embodiments. However, a circular shape maximizes certain functional characteristics, such as facilitating minimal radial clearance between the rotor 10 and the spray nozzles (not shown) of the tool. The interior surface 40 defines several blind bores 44 (shown best in FIG. 6) and the circumferential surface 42 defines several openings 46 intersecting the blind bores 44. The blind bores 44 and the openings 46 are used in assembling the rotor 10 as discussed more fully below.

Figure 7:
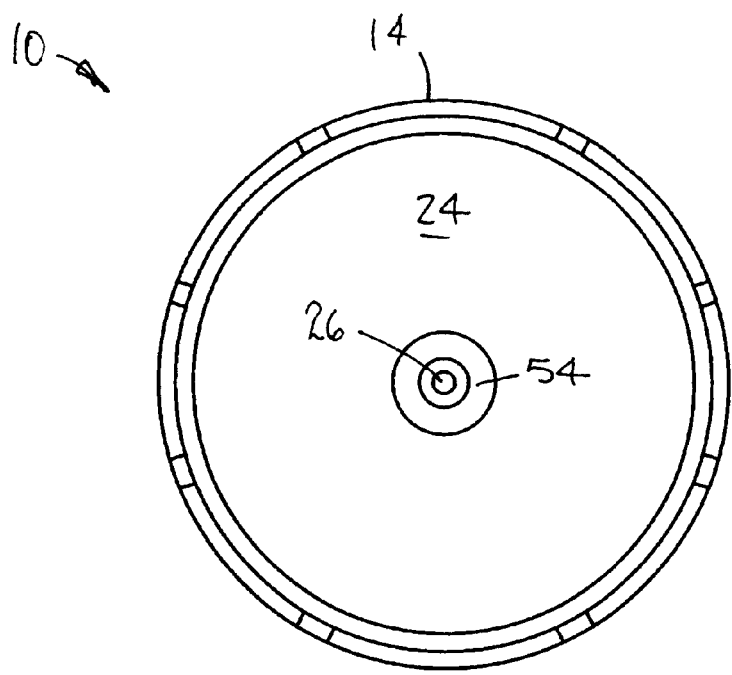

The bottom plate 14, like the top plate 12, also includes a circumferential surface 48 and is generally circularly-shaped. The top plate 12 and the bottom plate 14 are similarly shaped in this embodiment, but alternative embodiments may include differently shaped top and bottom plates 12, 14. However, again, functional considerations dictate that the top and bottom pates 12, 14 will be similarly shaped in most embodiments and that this shape will be circular. The interior surface 22 defines several blind bores 50 and the circumferential surface 48 defines several openings 52 intersecting the blind bores 50. The blind bores 50 and the openings 52 are used in assembling the rotor 10 as discussed more fully below. As noted above (and shown best in FIGS. 5 and 7), the exterior surface 24 defines the aperture 26 for receiving the rotating shaft 30. This aspect of the invention may be implemented in a broad range and the phrase "defines an aperture for receiving the rotating shaft" is to be construed broadly, as well. For instance, the aperture 26 in the illustrated embodiment is threaded and includes a lip 54 protruding from the exterior surface 24. In alternative embodiments not shown, the aperture 26 might be formed by fastening to the exterior surface 24 a separate piece containing a threaded blind bore.

Figure 4:
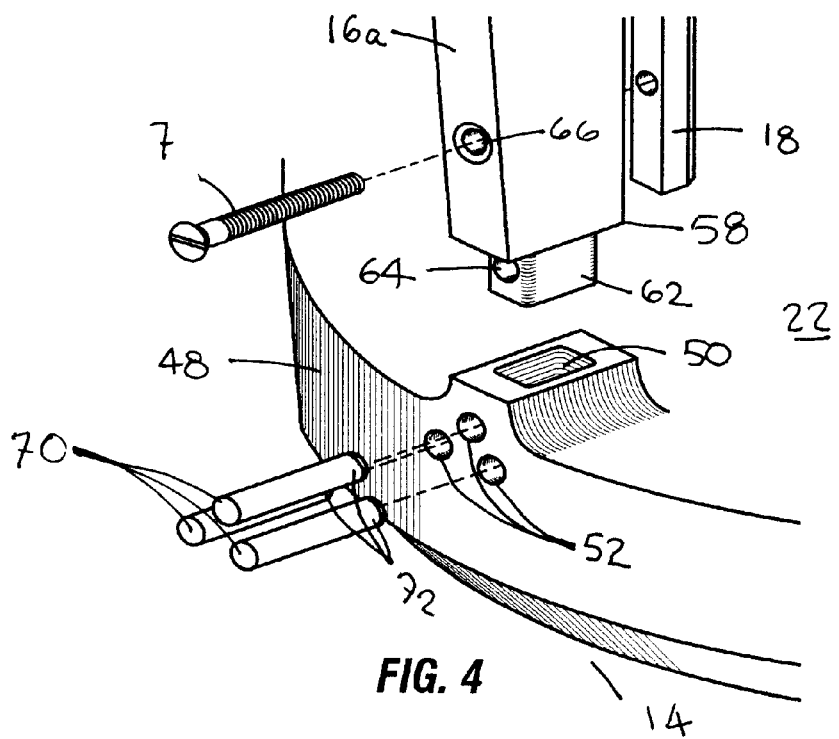
FIG. 4 is an exploded view of the joint in FIG. 3.

Each of the struts 16a–h is identically constructed, excepting only struts 16a–b as discussed more fully below. The radially distal surface 56 of the bottom end 58 of each strut 16a–h tapers in this particular embodiment to help maximize radial clearance between the rotor 10 and the spray nozzles (not show) of the tool. However, alternative embodiments may omit this tapering. The bottom end 58 and the top end 60 of each strut 16a–h includes a terminus 62 (shown best in FIGS. 2 and 4) shaped to mate with the blind bores 44, 50, respectively. Each terminus 62 includes a blind bore 64 on the radially distal surface thereof for use in assembling the rotor 10 as discussed below. The struts 16a–b also include a pair of radial, threaded bores 66 for fastening the retaining bars 18 thereto.

Figure 3:
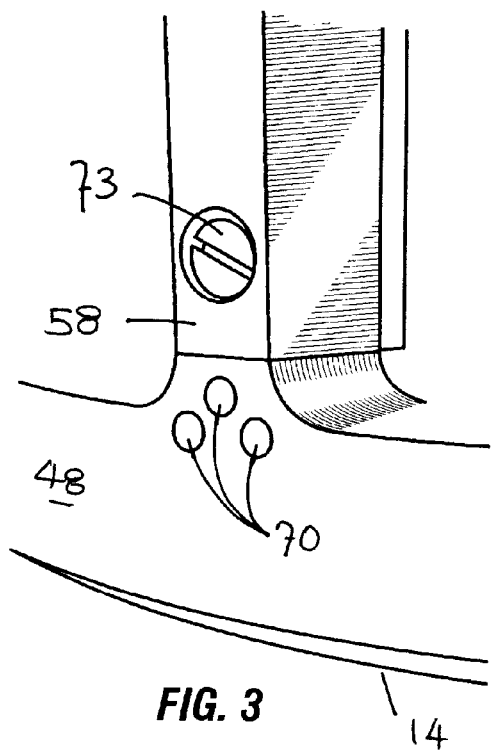
FIG. 3 is a fragmented, assembled view of a joint between a strut and a plate in the rotor of FIGS. 1–2.

The rotor 10 is assembled by press fitting the top and bottom plates 12, 14 to the struts 16a–h, fastening the press fitted parts, and then fastening the retainer bars 18 to the struts 16*a–b*. More particularly, and referring now to FIGS. 3–4, the terminus 62 for the bottom end 58 of each strut 16*a–h* is press fit into a blind bore 50 defined by the interior surface 22 of the bottom plate 14. This aligns the blind bores 64 with the openings 52. Press pins 70, each having a champfered end 72, are then pressed into the co-aligned openings 52 and blind bores 64 to fasten the struts 16*a–h* to the bottom plate 14. The process is repeated to fasten the top plate 12 to the struts 16*a–h*. The terminus 62 for the bottom end 60 of each strut 16*a–h* is press fit into a blind bore 44 so that press pins 70 may be pressed into the co-aligned openings 44 and blind bores 64. The retaining bars 18 are fastened to the struts 16*a–b* by threading screws 73 through the threaded bores 66 and into the bores 74 in the ends of the retaining bores 18.

Several features of the illustrated embodiment are implementation specific based upon particular functional considerations. One such feature noted above is the generally circular shape of the top and bottom plates 12, 14. Other features include the number and placement of the struts 16*a–h*. The struts 16*a–h* are spaced equidistantly and circumferentially about the rotor 10 relative to the top and bottom plates 12, 14 and in diametrically opposed pairs. The equidistant spacing and positioning in diametrically opposed pairs facilitates radial balancing, which is an important consideration. However, radial balancing can be achieved with varied spacing and odd numbers of struts. The placing and number of the struts 16*a–h* also impacts performance of the spray tool itself by virtue of their location between the wafers and the sprayed acid. Other embodiments might therefore choose to emphasize other functional considerations and use varied spacing, and/or struts not positioned in diametrically opposed pairs, and/or in various numbers.

The entire rotor 10, in the illustrated embodiment, excepting only the retaining bars 18, are constructed from polyphenelyne sulfide ("PPS") rather than the traditional PTFE employed by conventional approaches. PPS exhibits numerous unexpected advantages over PTFE including higher rigidity, superior dimensional stability, lighter weight, and a lower chemical absorption rate. The higher rigidity and lighter weight permit smaller dimensions for the rotor 10.

These unexpected advantages translate into superior performance in a number of ways in both existing chemical spray tools and in such tools that may be designed in the future specifically to exploit these advantages. The superior dimensional stability will allow the radial clearance between the rotor 10 and the spray nozzles to be reduced in new chemical spray tools. The smaller dimensions coupled with lessened radial clearance will also permit the wafers to be positioned much closer to the spray nozzles in new chemical spray tools. This is highly desirable as it produces a much more uniform spray across the wafers during processing. The difference in dimensions between the conventional PTFE rotor and the PPS rotor of the present invention arising from the material of construction is relatively large. So large, in fact, that new tools employing a PPS rotor can achieve both a greater radial clearance and position the wafers closer to the spray nozzles than can a PTFE rotor. Existing chemical spray tools retrofitted with PPS rotors will experience reduced downtime caused by contact between the rotor and the spray nozzles since the rotor will be both smaller and more dimensionally stable.

Because of these material characteristics, however, a rotor 10 constructed from PPS will radially balance slightly differently than will a rotor 10 constructed from PTFE. As will be appreciated by those in the art having the benefit of this disclosure, the process of radially balancing a PTFE rotor involves boring holes and, occasionally, adding PTFE blocks to center the mass of the rotor over the shaft. Typically, however, there is a sufficient consistency in manufacturing that the balancing process begins with drilling a predetermined pattern of holes in the rotor. The rotor is spun to see what additional adjustments need to be made, which are then implemented. The process continues until the rotor is balanced. This conventional process works equally well with PPS rotors, excepting only that the predetermined pattern of holes used for PTFE rotors may need to be altered for some embodiments. None of the balancing holes or blocks are shown in the illustrated embodiment because they are unique to each rotor.

Figure 5:
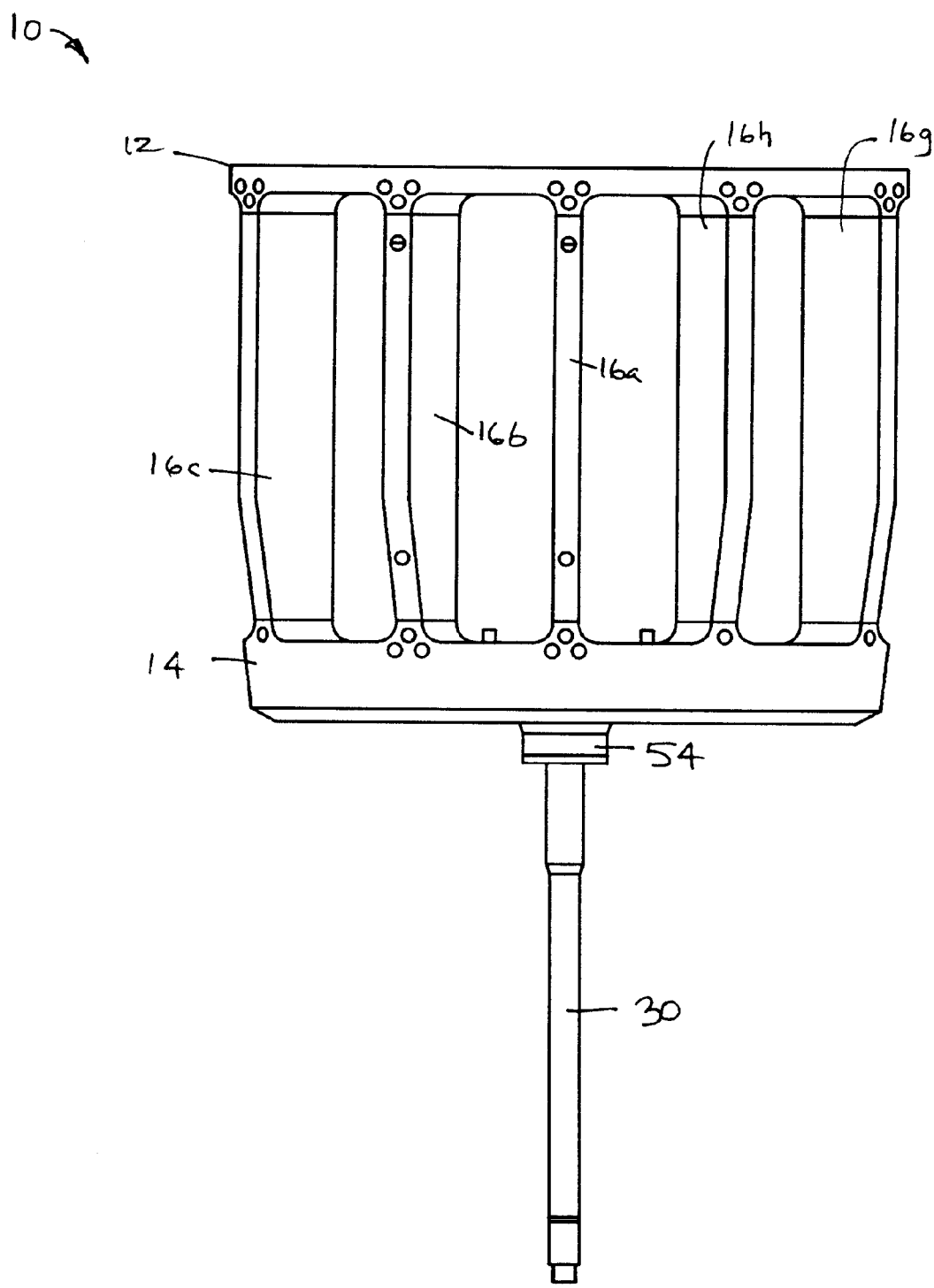
FIG. 5 is an assembled, side view of the rotor in FIGS. 1–2 including a rotating shaft.
Figure 6:
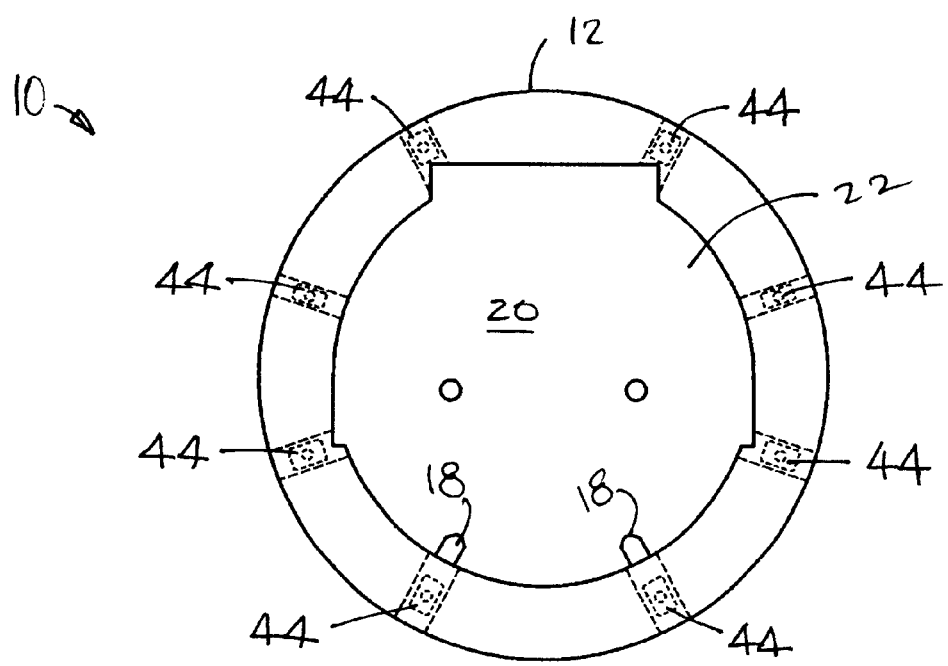
FIGS. 6–7 are top and bottom views, respectively, of the rotor in FIGS. 1–2.

One advantage of the illustrated embodiment is that it may be readily used to retrofit existing chemical spray tools. The shaft 30, shown in FIG. 5, is commercially available from SemaTool, Inc. as part number 550U0002-501, and is currently used on many of the spray chemical tools sold by SemaTool. Thus, the rotor 10 may be used to retrofit most existing SemaTool spray chemical tools. As those in the art having the benefit of this disclosure will appreciate, the shaft 30 may be changed out so that the rotor 10 may be used to retrofit tools by other manufacturers. The aperture 26 may be modified accordingly. Thus, one reason for the broad construction of the phrase "defines an aperture for receiving the rotating shaft."

However, the rotor 10 may also be used in new tools. To this end, various aspects of the illustrated embodiment may vary in alternative embodiments. For instance, the aperture 20 is keyed to a wafer cassette design recognized as "standard" by the industry, but may be altered to accommodate alternative wafer cassette designs. Alternative wafer cassette designs may also require longer or shorter rotors, and the length of the struts 16*a–h* may be adjusted accordingly. Another advantage of the small dimensions possible with the PPS rotor of the present invention is that the rotor may be constructed to accommodate a wafer cassette larger than a standard one and still be able to retrofit existing spray chemical tools.

The PPS rotor of the present invention will also prove advantageous in cleaning and repair because it may be disassembled. The ability to replace only pieces of a rotor instead of a whole rotor will result in substantial savings. As mentioned above, previous multi-piece rotors failed under the centrifugal forces inherent in the chemical spray process. However, the PPS rotor of the present invention will not do so primarily because: (1) the press fit of the strut termini into their respective blind bores operates as a mechanical stop against centrifugal forces on the struts, and (2) the press pins have little mass with which the centrifugal force may operate. Consequently, the struts and press pins remain in place even at the high rates of revolution in the chemical spray process.

The particular embodiment disclosed above is illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A multi-piece rotor for use in a chemical spray cleaner, the rotor comprising:
   a top plate defining an aperture keyed to a wafer cassette;
   a bottom plate including an interior surface on which the wafer cassette may bottom and an exterior surface defining an aperture for receiving a rotating shaft;
   a plurality of struts separating the top and bottom plates, each strut fastened at a top end thereof to the top plate and at a bottom end to the bottom plate; and
   a pair of retaining bars fastened to adjacent ones of the struts on the radially proximal surface thereof.

2. The multi-piece rotor of claim 1, wherein the bottom end of each strut tapers on the radially distal surface thereof.

3. The multi-piece rotor of claim 1, wherein each of the top plate, bottom plate, struts, and retaining bars is constructed from polyphenelyne sulfide.

4. The multi-piece rotor of claim 1, wherein the plurality of struts are spaced equidistantly circumferentially about the top plate and the bottom plate.

5. The multi-piece rotor of claim 4, wherein the plurality of struts are arranged in diametrically opposed pairs.

6. The multi-piece rotor of claim 1, wherein the plurality of struts are arranged in diametrically opposed pairs.

7. The multi-piece rotor of claim 1, wherein the plurality of struts includes eight struts.

8. The multi-piece rotor of claim 1, wherein each of the struts is fastened to the top plate by a pin pressed into an opening in the top plate and a blind bore in the radially distal surface of the top end of the strut, the opening and the blind bore being co-aligned upon press fitting the terminus of the top end into a recess defined by the interior surface of the top plate.

9. The multi-piece rotor of claim 8, wherein each of the struts is fastened to the bottom plate by a pin pressed into an opening in the bottom plate and a blind bore in the radially distal surface of the bottom end of the strut, the opening and the blind bore being co-aligned upon press fitting the terminus of the bottom end into a recess defined by the interior surface of the bottom plate.

10. The multi-piece rotor of claim 1, wherein each of the struts is fastened to the bottom plate by a pin pressed into an opening in the bottom plate and a blind bore in the radially distal surface of the bottom end of the strut, the opening and the blind bore being co-aligned upon press fitting the terminus of the bottom end into a recess defined by the interior surface of the bottom plate.

11. A multi-piece rotor constructed from polyphenelyne sulfide for use in a chemical spray cleaner, the rotor including a plurality of struts, each of the struts being press fit into a top and a bottom plate at either end, the press fit creating a mechanical stop against centrifigul force.

12. The multi-piece rotor of claim 11, wherein the multi-piece rotor is assembled with polyphenelyne sulfide fasteners.

13. The multi-piece rotor of claim 11, wherein:
   the top plate defines an aperture keyed to a wafer cassette;
   the bottom plate includes a first surface on which the wafer cassette may bottom and a second surface defining an aperture for receiving a rotating shaft; and
   the plurality of struts separates the top and bottoms plates, each strut fastened at a top end thereof to the top plate and at a bottom end to the bottom plate, and spaced equidistantly circumferentially about the top plate and the bottom plate the bottom end of each strut tapering on the radially distal surface thereof; and
   wherein the rotor further comprises:
      a pair of retaining bars fastened to adjacent ones of the struts on the radially proximal surface thereof.

14. A rotor constructed from polyphenelyne sulfide for use in a chemical spray cleaner, the rotor comprising a plurality of struts, each of the struts being press fit into a top and a bottom plate at either end, the press fit creating a mechanical stop against centrifigul force.

15. The rotor of claim 14, wherein the multi-piece rotor is assembled with polyphenelyne sulfide fasteners.

16. The rotor of claim 15, wherein:
   the top plate defines an aperture keyed to a wafer cassette;
   the bottom plate includes a first surface on which the wafer cassette may bottom and a second surface defining an aperture for receiving a rotating shaft; and
   the plurality of struts are spaced equidistantly circumferentially about the top plate and the bottom plate the bottom end of each strut tapering on the radially distal surface thereof; and
   further comprising:
      a pair of retaining bars fastened to adjacent ones of the struts on the radially proximal surface thereof.

* * * * *